(12) United States Patent
Lee et al.

(10) Patent No.: US 8,142,839 B2
(45) Date of Patent: *Mar. 27, 2012

(54) METHOD FOR FABRICATING A DISPLAY DEVICE

(75) Inventors: Jun-Yeob Lee, Sungnam (KR); Tae-Min Kang, Suwon (KR); Jang-Hyuk Kwon, Suwon (KR); Seong-Taek Lee, Suwon (KR); Jun-Hyo Chung, Suwon (KR); Eung-Jin Kim, Seoul (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 495 days.

This patent is subject to a terminal disclaimer.

(21) Appl. No.: 11/011,596

(22) Filed: Dec. 15, 2004

(65) Prior Publication Data

US 2005/0100661 A1    May 12, 2005

Related U.S. Application Data

(63) Continuation of application No. 10/167,420, filed on Jun. 13, 2002.

(30) Foreign Application Priority Data

Nov. 26, 2001 (KR) .................................. 2001-73822

(51) Int. Cl.
  *B05D 5/06* (2006.01)
  *H05B 7/00* (2006.01)
(52) U.S. Cl. ........................................ 427/66; 427/596
(58) Field of Classification Search .................... 427/66, 427/596
  See application file for complete search history.

(56) References Cited

U.S. PATENT DOCUMENTS

| | | | |
|---|---|---|---|
| 5,220,348 A | 6/1993 | D'Aurelio et al. | |
| 5,256,506 A | 10/1993 | Ellis et al. | |
| 5,278,023 A | 1/1994 | Bills et al. | |
| 5,308,737 A | 5/1994 | Bills et al. | |
| 5,521,035 A | 5/1996 | Wolk et al. | |
| 5,684,365 A | 11/1997 | Tang et al. | |
| 5,981,136 A | 11/1999 | Chang | |
| 5,990,629 A * | 11/1999 | Yamada et al. | 315/169.3 |
| 5,998,085 A | 12/1999 | Isberg et al. | |
| 6,057,067 A | 5/2000 | Isberg et al. | |

(Continued)

FOREIGN PATENT DOCUMENTS

EP        0 851 714 A2    7/1998

(Continued)

OTHER PUBLICATIONS

T. Shimoda, el al., Multicolor Pixel Patterning of Light-Emitting Polymers by Ink-Jet Printing, SID Digest p. 376, IEEE '99 p. 107.

(Continued)

*Primary Examiner* — James Lin
(74) *Attorney, Agent, or Firm* — Christie, Parker & Hale, LLP

(57) ABSTRACT

A display device includes an underlying layer formed over a substrate; an insulating layer formed over the substrate to expose the underlying layer; and an organic EL layer formed on the exposed portion of the underlying layer, wherein a thickness of the insulating layer is formed to a predetermined thickness to prevent defects in the organic EL layer that can occur in an edge portion of the exposed portion.

18 Claims, 10 Drawing Sheets

U.S. PATENT DOCUMENTS

| | | | |
|---|---|---|---|
| 6,120,338 | A | 9/2000 | Hirano et al. |
| 6,140,009 | A | 10/2000 | Wolk et al. |
| 6,190,826 | B1 | 2/2001 | Chang et al. |
| 6,194,119 | B1 * | 2/2001 | Wolk et al. ............ 430/200 |
| 6,228,555 | B1 | 5/2001 | Hoffend et al. |
| 6,246,179 | B1 | 6/2001 | Yamada |
| 6,270,934 | B1 | 8/2001 | Chang et al. |
| 6,284,425 | B1 | 9/2001 | Staral et al. |
| 6,297,589 | B1 | 10/2001 | Miyaguchi et al. |
| 6,366,025 | B1 | 4/2002 | Yamada |
| 6,538,390 | B2 | 3/2003 | Fujita et al. |
| 6,592,933 | B2 * | 7/2003 | Himeshima et al. ............ 427/66 |
| 6,829,023 | B2 | 12/2004 | Goto |
| 6,891,136 | B2 | 5/2005 | Jeffrey et al. |
| 7,009,339 | B2 * | 3/2006 | Lee et al. .................. 313/504 |
| 2001/0015256 | A1 * | 8/2001 | Yamazaki et al. ............ 156/289 |
| 2001/0020922 | A1 * | 9/2001 | Yamazaki et al. ............ 345/45 |
| 2001/0025959 | A1 * | 10/2001 | Yamazaki et al. ............ 257/72 |
| 2001/0026125 | A1 * | 10/2001 | Yamazaki et al. ............ 313/505 |
| 2002/0036462 | A1 | 3/2002 | Hirano |
| 2002/0043932 | A1 | 4/2002 | Kawashima |
| 2002/0063515 | A1 | 5/2002 | Goto |
| 2002/0070663 | A1 | 6/2002 | Ogura et al. |
| 2003/0170491 | A1 * | 9/2003 | Liao et al. .................. 428/690 |
| 2003/0178948 | A1 | 9/2003 | Park et al. |
| 2005/0156518 | A1 | 7/2005 | Lee et al. |
| 2005/0264192 | A1 | 12/2005 | Lee et al. |

FOREIGN PATENT DOCUMENTS

| | | |
|---|---|---|
| EP | 0 969 701 | 1/2000 |
| EP | 1 063 630 A2 | 12/2000 |
| EP | 1 096 303 A2 | 5/2001 |
| EP | 1 103 947 A2 | 5/2001 |
| EP | 1 130 947 A2 | 5/2001 |
| JP | 3-250583 | 11/1991 |
| JP | 2000-323276 | 11/2000 |
| JP | 2001-175200 | 6/2001 |
| JP | 2001-290441 | 10/2001 |
| KR | 10-0195175 | 9/1998 |
| KR | 1996-70731 | 9/1998 |
| KR | 2001-56710 | 7/2001 |
| KR | 2002-0016128 | 4/2002 |

OTHER PUBLICATIONS

Chinese Office Action issued in corresponding Chinese Patent Application No. 02152610.9.

U.S. Appl. No. 11/011,595, filed Dec. 15, 2004, Jun-Yeob Lee et al., Samsung SDI.

U.S. Appl. No. 11/175,183, filed Jul. 7, 2005, Jun-Yeob Lee et al., Samsung SDI.

U.S. Appl. No. 11/312,547, filed Dec. 21, 2005, Jun-Yeob Lee et al., Samsung SDI.

Office Action issued in Japanese Patent Application No. 2002-338475 on Aug. 1, 2006.

U.S. Office action dated Sep. 11, 2006, for cross-reference U.S. Appl. No. 11/011,595 (now U.S. Patent 7,705,534), 11 pages.

U.S. Office action dated Mar. 7, 2007, for cross-reference U.S. Appl. No. 11/011,595 (now U.S. Patent 7,705,534), 12 pages.

U.S. Office action dated Apr. 15, 2008, for cross-reference U.S. Appl. No. 11/011,595 (now U.S. Patent 7,705,534), 13 pages.

U.S. Office action dated Oct. 17, 2008, for cross-reference U.S. Appl. No. 11/011,595(now U.S. Patent 7,705,534), 18 pages.

* cited by examiner

METHOD FOR FABRICATING A DISPLAY DEVICE

CROSS REFERENCE

This application is a continuation of prior U.S. patent application Ser. No. 10/167,420, filed on Jun. 13, 2002, which claims the benefit of Korean Application No. 2001-73822, filed on Nov. 26, 2001, both of which are hereby incorporated by reference for all purposes as if fully set forth herein.

BACKGROUND OF THE INVENTION

1. Field of the Invention

The present invention relates to a full color organic EL display device and a method of manufacturing the same.

2. Description of Related Art

A full color organic EL display device includes an anode electrode, a hole injection layer, a hole transport layer, an organic EL layer having R, G and B color patterns, an electron transport layer, an electron injection layer, and a cathode electrode, which are sequentially stacked on an insulating substrate.

Of these, the organic EL layer is formed by using a vacuum deposition technique or a light etching technique using a shadow mask.

However, the vacuum deposition technique has a disadvantage in that there is a limitation on a minimum value of a physical gap and a large-sized organic EL display device, and it cannot be applied to an organic EL display device having fine patterns of tens of micrometers (μm) due to, for example, a mask transformation.

The light etching technique also has a disadvantage in that the organic EL layer can deteriorate due to a developing solution and etchant even though it can form fine patterns.

In order to overcome the above problems, a method of forming the organic EL layer using a thermal transfer technique is introduced. The thermal transfer technique is one which transfers a color pattern of the transfer film onto a substrate using a heat energy generated by light emitted from a light source.

Such a thermal transfer technique includes two techniques. One is related to controlling the light source, and the other is related to a configuration of the transfer film.

A laser beam is mainly used as a light source. A pigment colorant of the transfer film is scanned by the laser beam according to a desired pattern and transferred to the substrate, thereby forming a color pattern on the substrate.

U.S. Pat. No. 5,521,035 discloses methods of preparing color filter elements using laser induced transfer of colorants, wherein a Nd:YAG laser is used as a light source. The Nd:YAG laser forms a gaussian shaped beam having a Gauss distribution. The gaussian shaped beam, for example, having a diameter of more than 60 micrometers (μm), shows a characteristic that an energy distribution is gentler as it becomes more distant from a central point thereof. When the color pattern is formed using the gaussian shaped beam having a predetermined diameter, an intensity of the laser beam at an edge of the color pattern becomes weak. Consequently, the edge of the color pattern transferred is not clear and has a bad quality.

Techniques for a configuration of the transfer film are disclosed in U.S. Pat. No. 5,220,348 of D'Aurelio et al., U.S. Pat. No. 5,256,506 of Ellis et al., U.S. Pat. No. 5,278,023 of Bills et al., U.S. Pat. No. 5,308,737 of Bills et al., U.S. Pat. No. 5,998,085 of Isberg et al., U.S. Pat. No. 6,228,555 of Hoffend et al., U.S. Pat. Nos. 6,194,119 and 6,140,009 of Wolk et al., U.S. Pat. No. 6,057,067 of Isberg et al., U.S. Pat. No. 6,284,425 of Staral et al., U.S. Pat. Nos. 6,270,934, 6,190,826, and 5,981,136 of Jeffrey et al.

The techniques for a configuration of the transfer film are focused on a thermal transfer donor element which includes a base layer, a radiation absorber, a transfer layer and a gas-generating polymer layer. So, the techniques for a configuration of the transfer film do not suggest an improvement on reducing a deterioration of the edge portion of the color pattern.

Meanwhile, a conventional full color organic EL display device is manufactured such that a transparent electrode made of, for example, indium tin oxide (ITO), is formed over a thin film transistor (TFT) array substrate, and an insulating layer is formed over the whole surface of the substrate to expose a portion of the transparent electrode, and finally an organic EL layer is formed on the exposed portion of the transparent electrode.

An edge portion of the transparent electrode is covered with the insulating layer. This prevents a deterioration of the organic EL layer to increase a life span of the low molecular organic EL display device, and forms a wall to prevent a leakage of a solution during an ink-jet printing process to form the organic EL layer in the high molecular organic EL device. The technique is disclosed in EP 969701, SID 99 Digest P. 396, IEEE '99 P. 107, and other similar documents.

Meanwhile, methods of manufacturing the full color organic EL display device using a laser transfer (i.e., thermal transfer) technique are disclosed in Korean Patent No. 10-0195175, Korean Patent Application No. 2000-49287, and U.S. Pat. No. 5,998,085. The transfer film is in contact with the TFT array substrate, and is scanned using a laser beam. The laser beam is absorbed into a light absorber of the transfer film and so is converted into a heat energy. An organic electroluminescent material is transferred from the transfer film to the substrate by the heat energy to thereby form a color pattern of the organic EL layer.

In the conventional art, a thickness of the insulating layer is set from 500 nm to 1000 nm or more than 1000 nm in consideration of a parasitics capacitance. Due to the thick thickness of the insulating layer, defects in the edge of the organic thin layer occur in the case that the organic EL layer is formed using the laser transfer technique.

These defects can result from a characteristic of an underlying layer formed under the organic EL layer. For example, the defects occur when the underlying layer is formed non-uniformly, when the organic EL layer is not formed on the edge portion of the insulating layer to form a hole, or when the underlying layer is separated from other layers.

U.S. Pat. No. 5,684,365 discloses a method of preventing defects of the organic EL layer which can occur in a boundary between the transparent electrode and the insulating layer.

FIG. 1 is a cross-sectional view illustrating an organic EL display device shown in U.S. Pat. No. 5,684,365. Referring to FIG. 1, a semiconductor layer 120 is formed on an insulating substrate 100 in the form of an island. The semiconductor layer 120 includes source and drain regions 124 and 125, respectively, and is made of poly silicon. A gate insulating layer 130 is formed over the whole surface of the insulating substrate 100 and covers the semiconductor layer 120. A gate electrode 135 is formed on the gate insulating layer 130. An interlayer insulating layer 140 is formed on the gate insulating layer 130 and covers the gate electrode 135. Contact holes 144 and 145 are formed to expose a portion of the source region 124 and a portion of the drain region 125, respectively. A source electrode 154 is electrically connected to the source region 124 via the contact hole 144. A pixel electrode 170 is electrically connected to the drain region 125 via the contact hole 145. A passivation layer 180 is formed over the whole surface of the insulating substrate 100 to expose a portion of the pixel electrode 170, thereby forming an opening portion 185. An organic EL layer 190 is formed on the exposed portion of the pixel electrode 170 through the opening portion 185. A cathode electrode 195 is formed to cover the organic EL layer 190.

An edge of the passivation layer 180 defining the opening portion 185 has a taper angle of 10° to 30°. The tapered edge of the passivation layer 180 serves to improve an adhesion of the organic EL layer 190, thereby preventing defects of the organic EL layer 190.

However, in the case of forming the organic EL layer using the laser transfer technique, there are still problems in that the defects in the edge of the organic thin layer occur when the thickness of the insulating layer is more than 500 nm, even though the insulating layer is formed in order to form a taper angle in the edge of the passivation layer.

SUMMARY OF THE INVENTION

Accordingly, it is an object of the present invention to provide an organic EL display device and a method of manufacturing the same, which can prevent defects of an organic EL layer which can occur in an edge portion of an opening portion.

Additional objects and advantages of the invention will be set forth in part in the description which follows and, in part, will be obvious from the description, or may be learned by practice of the invention.

The foregoing and other objects of the present invention are achieved by providing a display device comprising: an underlying layer formed over a substrate; an insulating layer formed over the substrate to expose the underlying layer; and an organic EL layer formed on the exposed portion of the underlying layer, wherein a thickness of the insulating layer is less than 500 nm.

The foregoing and other objects of the present invention may also be achieved by providing an organic EL display device comprising: a thin film transistor having source and drain electrodes formed over a substrate; a lower electrode contacting one of the source and drain electrodes of the thin film transistor; an insulating layer formed over the substrate to expose the lower electrode; and an organic EL layer formed on the exposed portion of the lower electrode, wherein a thickness of the insulating layer is less than 500 nm.

The foregoing and other objects of the present invention may also be achieved by providing a method of manufacturing a display device comprising: forming an underlying layer over a substrate; forming an insulating layer over a substrate to expose the underlying layer; and forming an organic EL layer on the exposed portion of the underlying layer, wherein a thickness of the insulating layer is less than 500 nm.

The method further comprises forming a thin film transistor having source and drain electrodes over the substrate before the forming of the underlying layer. The underlying layer is a lower electrode connecting one of the source and drain electrodes of the thin film transistor. The organic EL layer is formed using a laser transfer technique.

In an embodiment of the present invention, the thickness of the insulating layer is less than 200 nm. In an alternative embodiment, the thickness of the insulating layer is in a range between 10 nm and 500 nm. In yet another alternative embodiment, the thickness of the insulating layer is in a range between 100 nm and 200 nm.

The insulating layer is formed to cover an edge of the underlying layer. A portion of the insulating layer corresponding to the edge of the underlying layer has a thickness of less than 200 nm. A portion of the insulating layer corresponding to an edge of the underlying layer has a thickness of 10 nm to 500 nm. The portion of the insulating layer corresponding to the edge of the underlying layer has a thickness of 100 nm to 200 nm.

In an aspect of the present invention, a step from the insulating layer to the underlying layer is less than 200 nm. In another aspect of the invention, a step from the insulating layer to the underlying layer is in a range between 10 nm to 500 nm. More specifically, the step from the insulating layer to the underlying layer is in a range between 100 nm to 200 nm.

BRIEF DESCRIPTION OF THE DRAWINGS

These and other objects and advantages of the invention will become apparent and more readily appreciated from the following description of the embodiments, taken in conjunction with the accompanying drawings of which.

DETAILED DESCRIPTION OF PREFERRED EMBODIMENTS

Figure 1:
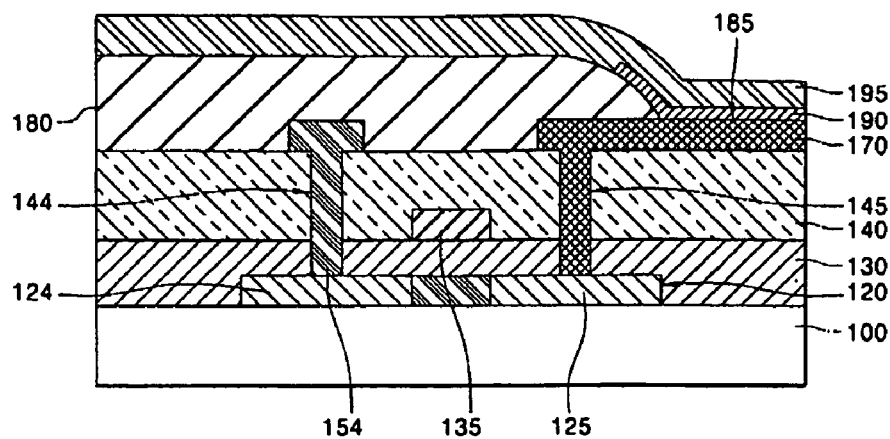
FIG. 1 is a cross-sectional view illustrating a conventional organic EL display device.

Reference will now be made in detail to the embodiments of the present invention, examples of which are illustrated in the accompanying drawings, wherein like reference numerals refer to like elements throughout. The embodiments are described below in order to explain the present invention by referring to the figures.

Though the present invention reduces a thickness of the insulating layer as less than 500 nm and an organic EL display device of the present invention don't have defect due to a parasitics capacitance, thereby a transfer characteristics of the present invention can be improved.

Figure 2:
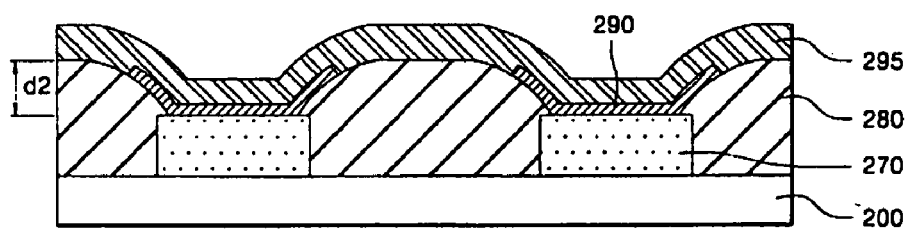
FIG. 2 is a cross-sectional view illustrating a passive matrix organic EL display device according to an embodiment of the present invention.

FIG. 2 is a cross-sectional view illustrating a passive matrix organic EL display device according to an embodiment of the present invention.

An anode electrode 270 is formed on an insulating substrate 200. The anode electrode 270 also serves as a pixel electrode and is made of a transparent conductive material such as indium tin oxide (ITO) and indium zinc oxide (IZO). An insulating layer 280 is formed to cover an edge of the pixel electrode 270. An organic EL layer 290 is formed on the pixel electrode 270. A cathode electrode 295 is formed on the insulating layer 280 and covers the organic EL layer 290. Distance d2 represents a step difference between an upper surface of the insulating layer 280 and an upper surface of the pixel electrode 270.

The organic EL layer 290 includes a hole injection layer, a hole transport layer, a light-emitting layer having R, G and B color patterns, an electron transport layer, and an electron injection layer, which are sequentially stacked.

The insulating layer 280 has a thickness of less than 500 nm and preferably 10 nm to 500 nm. A thickness d2 of a portion of the insulating layer 280 corresponding to an edge portion of the pixel electrode 270 is less than 500 nm, preferably 10 nm to 500 nm, and more preferably 100 nm to 200 nm.

Figure 10:
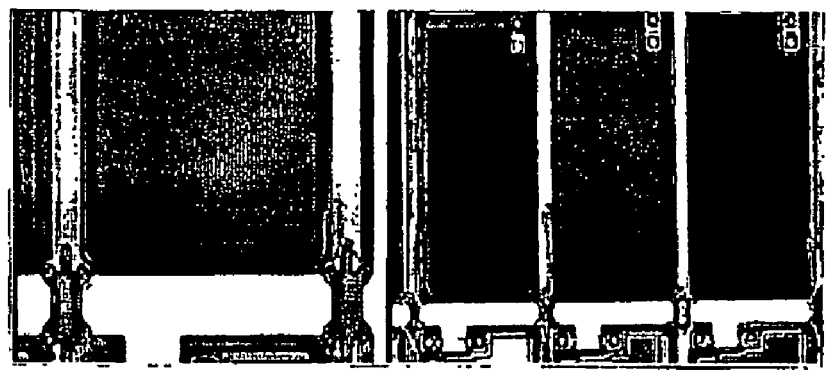
FIG. 10 is a photograph illustrating the organic EL layer of the organic display device according to an embodiment of the present invention.

When the organic EL layer 290 is formed to cover an edge portion of the insulating layer 280 having a thickness described above, edge defects of the organic EL layer 290 do not occur in a boundary between the pixel electrode 270 and the insulating layer 280, as shown in FIG. 10.

Figure 3:
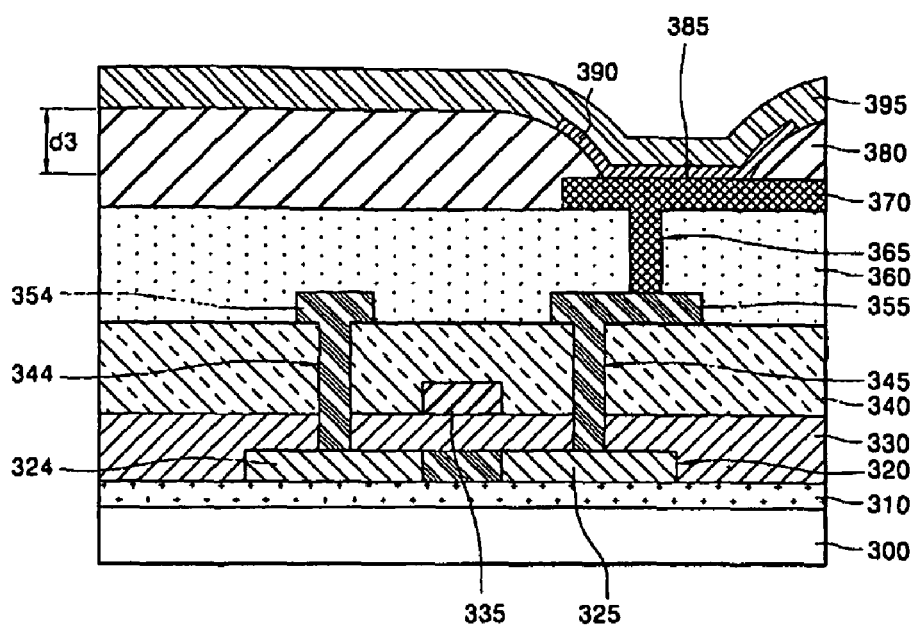
FIG. 3 is a cross-sectional view illustrating a top-gate type thin film transistor (TFT) organic EL display device according to another embodiment of the present invention.

FIG. 3 is a cross-sectional view illustrating a top-gate type thin film transistor (TFT) organic EL display device according to another embodiment of the present invention.

A buffer layer 310 is formed on an insulating substrate 300. A semiconductor layer 320 is formed on the buffer layer 310. The semiconductor layer 320 includes source and drain regions 324 and 325, respectively. A gate insulating layer 330 is formed over the whole surface of the insulating substrate 300 and covers the semiconductor layer 320. A gate electrode 335 is formed on the gate insulating layer 330. An interlayer insulating layer 340 is formed over the whole surface of the insulating substrate 300 and covers the gate electrode 335. Contact holes 344 and 345 are formed to expose a portion of the source region 324 and a portion of the drain region 325, respectively. Source and drain electrodes 354 and 355 are electrically connected to the source and the drain regions 324 and 325 through the contact holes 344 and 345, respectively.

A passivation layer 360 is formed over the whole surface of the insulating substrate 300. A via hole 365 is formed to expose either the source or the drain electrodes 354 and 355. In FIG. 3, the via hole 365 exposes a portion of the drain electrode 355. A pixel electrode 370 is formed on the passivation layer 360 and is electrically connected to the drain electrode 355 through the via hole 365. The pixel electrode 370 serves as an anode electrode.

A planarization layer 380 is formed on the passivation layer 360 and covers an edge portion of the pixel electrode 370 to expose a portion of the pixel electrode 370, thereby forming an opening portion 385 on the pixel electrode 370. An organic EL layer 390 is formed on the exposed portion of the pixel electrode 370 and covers an edge portion of the planarization layer 380. A cathode electrode 395 is formed on the planarization layer 380 and covers the organic EL layer 390.

The organic EL layer 390 includes a hole injection layer, a hole transport layer, a light-emitting layer having R, G and B color patterns, an electron transport layer, and an electron injection layer, which are sequentially stacked.

The planarization layer 380 has a thickness of less than 500 nm and preferably 10 nm to 500 nm. A thickness d3 of a portion of the insulating layer 380 corresponding to an edge portion of the pixel electrode 370 is less than 500 nm, preferably 10 nm to 500 nm, and more preferably 100 nm to 200 nm.

When the organic EL layer 390 is formed to cover an edge portion of the insulating layer 380 having a thickness described above, edge defects of the organic EL layer 390 do not occur in a boundary between the pixel electrode 370 and the insulating layer 380, as shown in FIG. 10.

Figure 4:
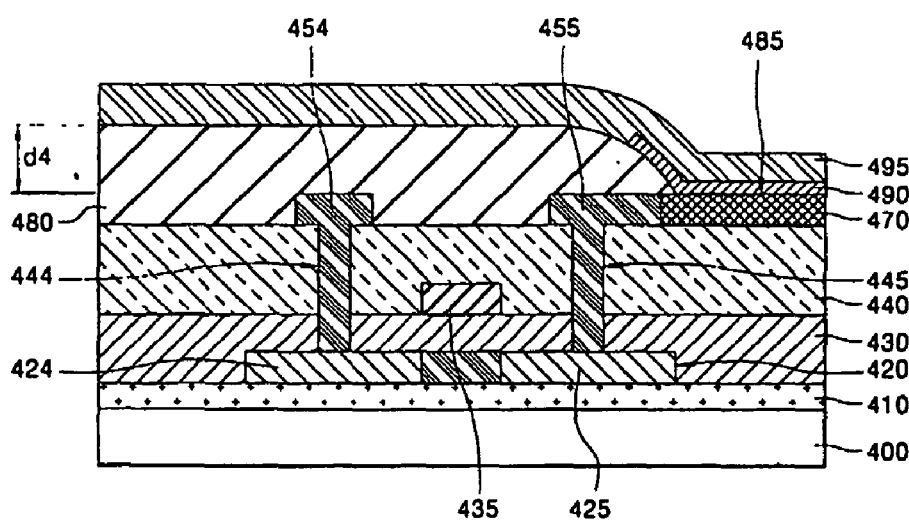
FIG. 4 is a cross-sectional view illustrating a top-gate type TFT organic EL display device according to yet another embodiment of the present invention.

FIG. 4 is a cross-sectional view illustrating a top-gate type TFT organic EL display device according to another embodiment of the present invention.

A buffer layer 410 is formed on an insulating substrate 400. A semiconductor layer 420 is formed on the buffer layer 410. The semiconductor layer 420 includes source and drain regions 424 and 425, respectively. A gate insulating layer 430 is formed over the whole surface of the insulating substrate 400 and covers the semiconductor layer 420. A gate electrode 435 is formed on the gate insulating layer 430. An interlayer insulating layer 440 is formed over the whole surface of the insulating substrate 400 and covers the gate electrode 435. Contact holes 444 and 445 are formed to expose a portion of the source region 424 and a portion of the drain region 425, respectively. Source and drain electrodes 454 and 455 are electrically connected to the source and the drain regions 424 and 425 through the contact holes 444 and 445, respectively.

A pixel electrode 470 is formed on the interlayer insulating layer 440 and is electrically connected to either of the source and the drain electrodes 454 and 455. In FIG. 4, the pixel electrode 470 is electrically to the drain electrode 455. The pixel electrode 470 serves as an anode electrode.

An insulating layer 480 is formed on the interlayer insulating layer 440 and covers an edge portion of the pixel electrode 470 to expose a portion of the pixel electrode 470, thereby forming an opening portion 485 on the pixel electrode 470. The insulating layer 480 is a passivation layer or a planarization layer.

An organic EL layer 490 is formed on the exposed portion of the pixel electrode 470 and covers an edge portion of the planarization layer 480. A cathode electrode 495 is formed on the insulating layer 480 and covers the organic EL layer 490.

The organic EL layer 490 includes a hole injection layer, a hole transport layer, a light-emitting layer having R, G and B color patterns, an electron transport layer, and an electron injection layer, which are sequentially stacked.

The insulating layer 480 has a thickness of less than 500 nm and preferably 10 nm to 500 nm. A thickness d4 of a portion of the insulating layer 480 corresponding to an edge portion of the pixel electrode 470 is less than 500 nm, preferably 10 nm to 500 nm, and more preferably 100 nm to 200 nm.

When the organic EL layer 490 is formed to cover an edge portion of the insulating layer 480 having a thickness described above, edge defects of the organic EL layer 490 do not occur in a boundary between the pixel electrode 470 and the insulating layer 480 as shown in FIG. 10.

Figure 5:
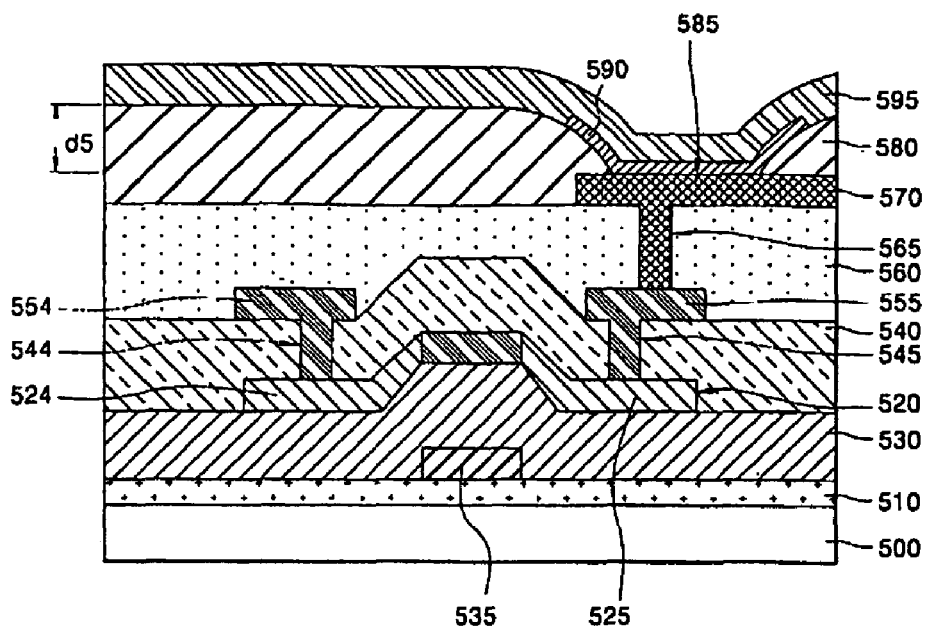
FIG. 5 is a cross-sectional view illustrating a bottom-gate type TFT organic EL display device according to yet another embodiment of the present invention.

FIG. 5 is a cross-sectional view illustrating a bottom-gate type TFT organic EL display device according to another embodiment of the present invention.

A buffer layer 510 is formed on an insulating substrate 500. A gate electrode 535 is formed on the buffer layer 510. A gate insulating layer 530 is formed over the whole surface of the insulating substrate 500 and covers the gate electrode 535. A semiconductor layer 520 is formed on the gate insulating layer 530. The semiconductor layer 520 includes source and drain regions 524 and 525, respectively. An interlayer insulating layer 540 is formed over the whole surface of the insulating substrate 500 and covers the semiconductor layer 520. Contact holes 544 and 545 are formed to expose a portion of the source region 524 and a portion of the drain region 525, respectively. Source and drain electrodes 554 and 555 are electrically connected to the source and the drain regions 524 and 525 through the contact holes 544 and 545, respectively.

A passivation layer 560 is formed over the whole surface of the insulating substrate 500. A via hole 565 is formed to expose either the source or the drain electrodes 554 and 555. In FIG. 5, the via hole 565 exposes a portion of the drain electrode 555. A pixel electrode 570 is formed on the passivation layer 560 and is electrically connected to the drain electrode 555 through the via hole 565. The pixel electrode 570 serves as an anode electrode.

A planarization layer 580 is formed on the passivation layer 560 and covers an edge portion of the pixel electrode 570 to expose a portion of the pixel electrode 570, thereby forming an opening portion 585 on the pixel electrode 570. An organic EL layer 590 is formed on the exposed portion of the pixel electrode 570 and covers an edge portion of the planarization layer 580. A cathode electrode 595 is formed on the planarization layer 580 and covers the organic EL layer 590.

The organic EL layer 590 includes a hole injection layer, a hole transport layer, a light-emitting layer having R, G and B color patterns, an electron transport layer, and an electron injection layer, which are sequentially stacked.

The planarization layer 580 has a thickness of less than 500 nm and preferably 10 nm to 500 nm. A thickness d5 of a portion of the insulating layer 580 corresponding to an edge portion of the pixel electrode 570 is less than 500 nm, preferably 10 nm to 500 nm, and more preferably 100 nm to 200 nm.

When the organic EL layer 590 is formed to cover an edge portion of the insulating layer 580 having a thickness described above, edge defects of the organic EL layer 590 do not occur in a boundary between the pixel electrode 570 and the insulating layer 380 as shown in FIG. 10.

Figure 6:
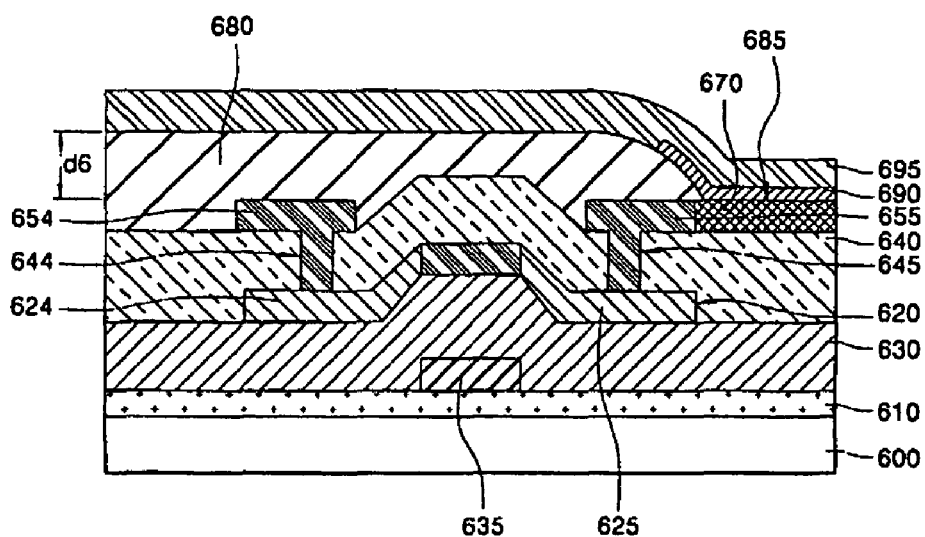
FIG. 6 is a cross-sectional view illustrating a bottom-gate type TFT organic EL display device according to yet another embodiment of the present invention.

FIG. 6 is a cross-sectional view illustrating a bottom-gate type TFT organic EL display device according to another embodiment of the present invention.

A buffer layer 610 is formed on an insulating substrate 600. A gate electrode 635 is formed on the buffer layer 610. A gate insulating layer 630 is formed over the whole surface of the insulating substrate 600 and covers the gate electrode 635. A semiconductor layer 620 is formed on the gate insulating layer 630. The semiconductor layer 620 includes source and drain regions 624 and 625, respectively. An interlayer insulating layer 640 is formed over the whole surface of the insulating substrate 600 and covers the semiconductor layer 620. Contact holes 644 and 645 are formed to expose a portion of the source region 624 and a portion of the drain region 625, respectively. Source and drain electrodes 654 and 655 are electrically connected to the source and the drain regions 624 and 625 through the contact holes 644 and 645, respectively.

A pixel electrode 670 is formed on the interlayer insulating layer 640 and is electrically connected to either the source or the drain electrodes 654 and 655. In FIG. 6, the pixel electrode 670 is electrically to the drain electrode 655. The pixel electrode 670 serves as an anode electrode.

An insulating layer 680 is formed on the interlayer insulating layer 640 and covers an edge portion of the pixel electrode 670 to expose a portion of the pixel electrode 670, thereby forming an opening portion 685 on the pixel electrode 670. The insulating layer 680 is the passivation layer or the planarization layer.

An organic EL layer 690 is formed on the exposed portion of the pixel electrode 670 and covers an edge portion of the planarization layer 680. A cathode electrode 695 is formed on the insulating layer 680 and covers the organic EL layer 690.

The organic EL layer 690 includes a hole injection layer, a hole transport layer, a light-emitting layer having R, G and B color patterns, an electron transport layer, and an electron injection layer, which are sequentially stacked.

The insulating layer 680 has a thickness of less than 500 nm and preferably 10 nm to 500 nm. A thickness d6 of a portion of the insulating layer 680 corresponding to an edge portion of the pixel electrode 670 is less than 500 nm, preferably 10 nm to 500 nm, and more preferably 100 nm to 200 nm.

When the organic EL layer 690 is formed to cover an edge portion of the insulating layer 680 having a thickness described above, edge defects of the organic EL layer 690 do not occur in a boundary between the pixel electrode 670 and the insulating layer 680, as shown in FIG. 10.

As described above, the organic EL layer can be formed without any defects by defining a thickness of the insulating layer.

Methods of manufacturing the organic EL display device according to several embodiments of the present invention are described below.

FIGS. 7A to 7D are cross-sectional views illustrating a process of manufacturing the organic EL display device of FIG. 3.

Figure 7A:
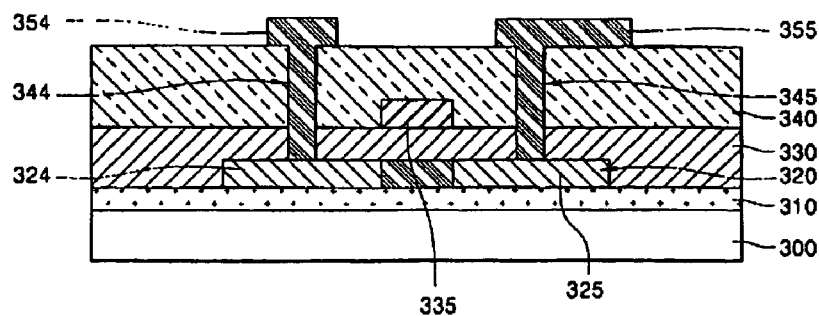
FIGS. 7A to 7D are cross-sectional views illustrating a process of manufacturing the organic EL display device of FIG. 3.

Referring to FIG. 7A, a buffer layer 310 is formed on an insulating substrate 300 after cleaning the insulating substrate 300. The insulating substrate 300 is preferably made of glass, but not limited thereto. The buffer layer 310 is preferably made of $SiO_2$, but not limited thereto. A semiconductor layer 320 is formed on the buffer layer 310. The semiconductor layer 320 is preferably made of a poly silicon, but not limited thereto. The semiconductor layer 320 can be formed by various methods. For example, an amorphous silicon layer is deposited on the buffer layer 310 and is annealed by using an excimer laser to form a poly silicon layer, and the poly silicon layer is patterned in the form of an island to thereby form the semiconductor layer 320.

A gate insulating layer 330 is formed over the whole surface of the insulating substrate 300 and covers the semiconductor layer 320. The gate insulating layer 330 is preferably made of $SiO_2$, but not limited thereto. A gate electrode 335 is formed on the gate insulating layer 330. Using the gate electrode 335 as a mask, a p- or an n-type impurity is ion-doped into the semiconductor layer 320 to form source and drain regions 324 and 325, respectively.

An interlayer insulating layer 340 is formed over the whole surface of the insulating substrate 300 and covers the gate electrode 335. The interlayer insulating layer 340 is preferably made of SiNx, but not limited thereto. The gate insulating layer 330 and the interlayer insulating layer 340 are etched to form contact holes 344 and 345 to expose a portion of the source region 324 and a portion of the drain region 325, respectively.

A metal layer is deposited on the interlayer insulating layer 340 and patterned into source and drain electrodes 354 and 355, respectively. The source and the drain electrodes 354 and 355 are electrically connected to the source and the drain regions 324 and 325 through the contact holes 344 and 345, respectively.

Figure 7B:
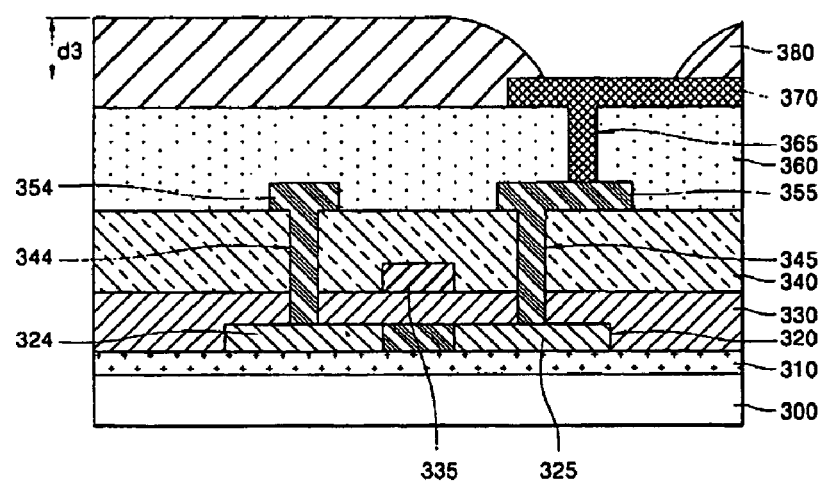

Referring to FIG. 7B, a passivation layer 360 is formed over the whole surface of the insulating substrate 300. The passivation layer is preferably made of SiO$_2$, but not limited thereto. The passivation layer 360 is patterned to form a via hole 365. The via hole 365 exposes either the source or the drain electrodes 354 and 355. In FIG. 7B, the via hole 365 exposes a portion of the drain electrode 355.

A transparent conductive layer is deposited on the passivation layer 360 to a thickness of 200 nm using a sputtering technique and dry-etched to form a pixel electrode 370 as an anode electrode. The pixel electrode 370 is preferably made of a transparent conductive material such as indium tin oxide (ITO) or indium zinc oxide (IZO). The pixel electrode 370 is electrically connected to the drain electrode 355 through the via hole 365.

Subsequently, a planarization layer 380 is formed on the passivation layer 360 and covers an edge portion of the pixel electrode 370 to expose a portion of the pixel electrode 370, thereby forming an opening portion 385 on the pixel electrode 370. In other words, an insulating layer made of acryl is deposited on the passivation layer 360 to a thickness of 350 nm using a spin-coating technique at a speed of 3000 rpm and patterned to define the opening portion 385. Thereafter, the insulating layer is baked at a temperature of 220° C., thereby forming the insulating layer 380 in which a taper angle of an edge portion thereof is 15° and a thickness d3 of a portion of the insulating layer formed on an edge of the pixel electrode 370 is 250 nm.

Figure 7C:
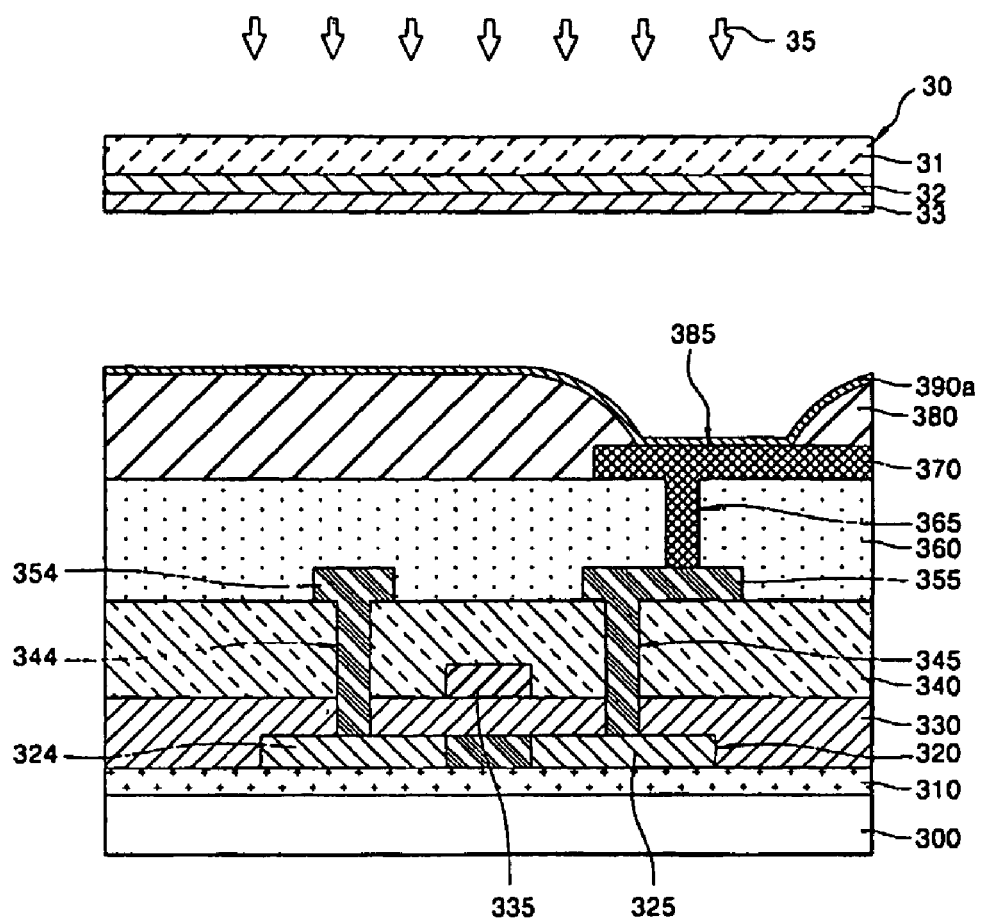
Figure 7D:
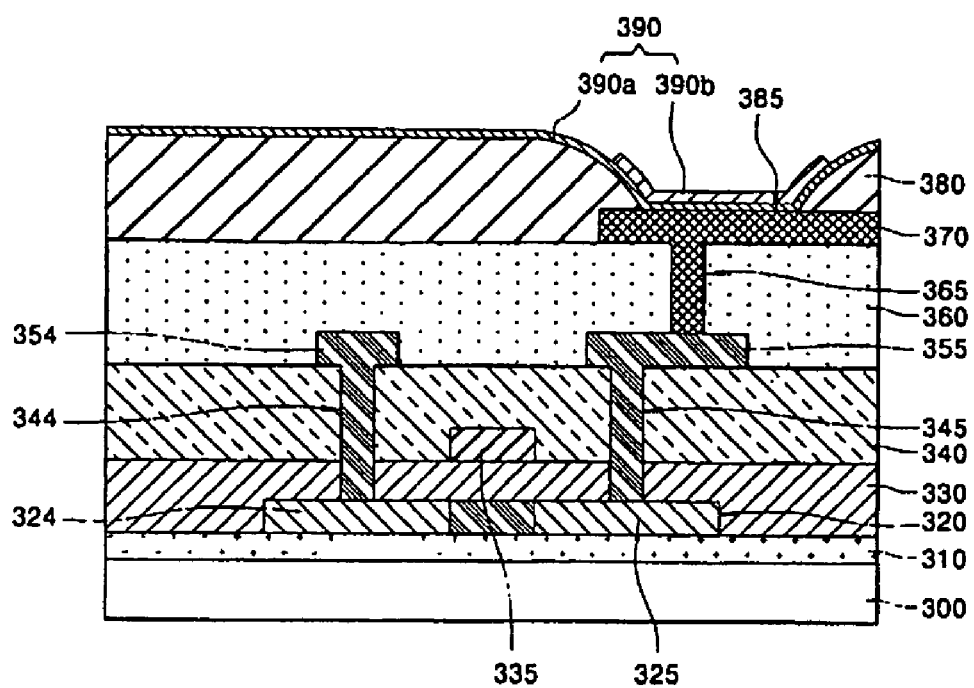

Referring to FIGS. 7C and 7D, an organic EL layer 390 is formed on the exposed portion of the pixel electrode 370 to cover an edge portion of the planarization layer 380 using a laser transfer technique.

In more detail, a PEDOT is spin-coated to a thickness of 50 nm at a speed of 3000 rpm and heat-treated at a temperature of 200° C. during five minutes to thereby form a hole transport layer 390a. Subsequently, three pieces of transfer films are manufactured. For the sake of description convenience, a method of manufacturing one transfer film 30 for an R color pattern is described.

The transfer film 30 for the R color pattern is manufactured as follows: on a base film 31 having a transfer layer 32 formed thereon, an R color organic electroluminescent material is spin-coated to a thickness of 80 nm at a speed of 2000 rpm using a xylene solution having a concentration of 1.0 wt/V %.

After aligning the transfer film 30 with the array substrate, the transfer film 30 is scanned by an infrared-rays laser 35 so that a desired pattern is transferred to the hole transport layer 390a, thereby forming the R color pattern 390b of the organic EL layer.

In the same method, G and B color patterns are formed to complete the organic EL layer 390. The organic EL layer 390 can further include a hole injection layer, an electron transport layer and an electron injection layer.

A cathode electrode 395 (see FIG. 3) is formed on the planarization layer 380 and covers the organic EL layer 390. Preferably, the cathode electrode 395 has a dual-layered structure of Ca/Ag. Preferably, the Ca layer and the Ag layer have a thickness of 30 nm and 270 nm, respectively.

Finally, an encapsulation process is performed to complete the organic EL display device according to the embodiments of the present invention.

FIGS. 8A to 8D are cross-sectional views illustrating a process of manufacturing the organic EL display device of FIG. 5.

Figure 8A:
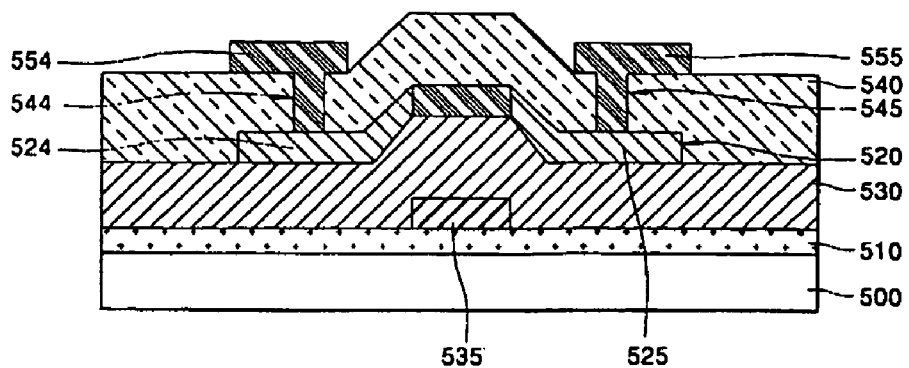
FIGS. 8A to 8D are cross-sectional views illustrating a process of manufacturing the organic EL display device of FIG. 5.

Referring to FIG. 8A, a buffer layer 510 is formed on an insulating substrate 500 after cleaning the insulating substrate 500. The insulating substrate 500 is preferably made of glass, but not limited thereto. The buffer layer 510 is preferably made of SiO$_2$, but not limited thereto. A gate electrode 535 is formed on the buffer layer 510. A gate insulating layer 530 is formed over the whole surface of the insulating substrate 500 and covers the gate electrode 535.

A semiconductor layer 520 is formed on the gate insulating layer 530. The semiconductor layer 520 is preferably made of a poly silicon, but not limited thereto. The semiconductor layer 520 can be formed by various methods. For example, an amorphous silicon layer is deposited on the gate insulating layer 530 and is annealed by using an excimer laser to form a poly silicon layer, and the poly silicon layer is patterned in the form of an island to thereby form the semiconductor layer 520.

Using the gate electrode 535 as a mask, a p- or an n-type impurity is ion-doped into the semiconductor layer 520 to form source and drain regions 524 and 525.

An interlayer insulating layer 540 is formed over the whole surface of the insulating substrate 500 and covers the gate electrode 535. The interlayer insulating layer 540 is preferably made of SiNx, but not limited thereto. The gate insulating layer 530 and the interlayer insulating layer 540 are etched to form contact holes 544 and 545 to expose a portion of the source region 524 and a portion of the drain region 525, respectively.

A metal layer is deposited on the interlayer insulating layer 540 and patterned into source and drain electrodes 554 and 555, respectively. The source and the drain electrodes 554 and 555 are electrically connected to the source and the drain regions 524 and 525 through the contact holes 544 and 545, respectively.

Figure 8B:
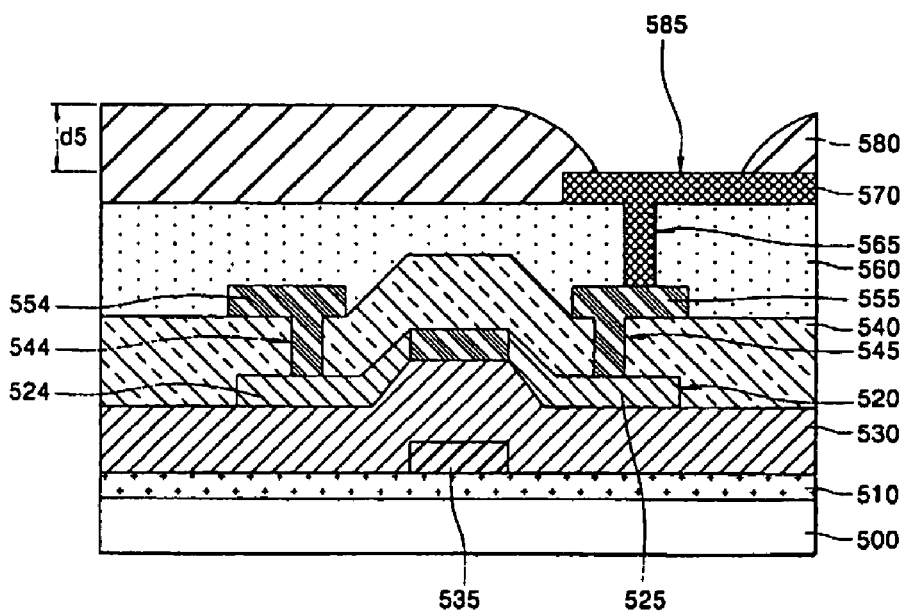

Referring to FIG. 8B, a passivation layer 560 is formed over the whole surface of the insulating substrate 500. The passivation layer 560 is preferably made of SiO$_2$, but not limited thereto. The passivation layer 560 is patterned to form a via hole 565. The via hole 565 exposes either the source or the drain electrodes 554 and 555. In FIG. 8B, the via hole 565 exposes a portion of the drain electrode 555.

A transparent conductive layer is deposited on the passivation layer 560 to a thickness of 200 nm using a sputtering technique and dry-etched to form a pixel electrode 570 as an anode electrode. The pixel electrode 570 is preferably made of a transparent conductive material such as indium tin oxide (ITO) or indium zinc oxide (IZO), but not limited thereto. The pixel electrode 570 is electrically connected to the drain electrode 555 through the via hole 565.

Subsequently, a planarization layer 580 is formed on the passivation layer 560 and covers an edge portion of the pixel electrode 570 to expose a portion of the pixel electrode 570, thereby forming an opening portion 585 on the pixel electrode 570. In other words, an insulating layer made of acryl is deposited on the passivation layer 560 to a thickness of 350 nm at a speed of 1300 rpm using a spin-coating technique and patterned to define the opening portion 585. Thereafter, the insulating layer is baked at a temperature of 220° C., thereby forming the insulating layer 580 in which a taper angle of an edge portion thereof is 15° and a thickness d5 of a portion of the insulating layer formed on an edge of the pixel electrode 570 is less than 250 nm.

Figure 8C:
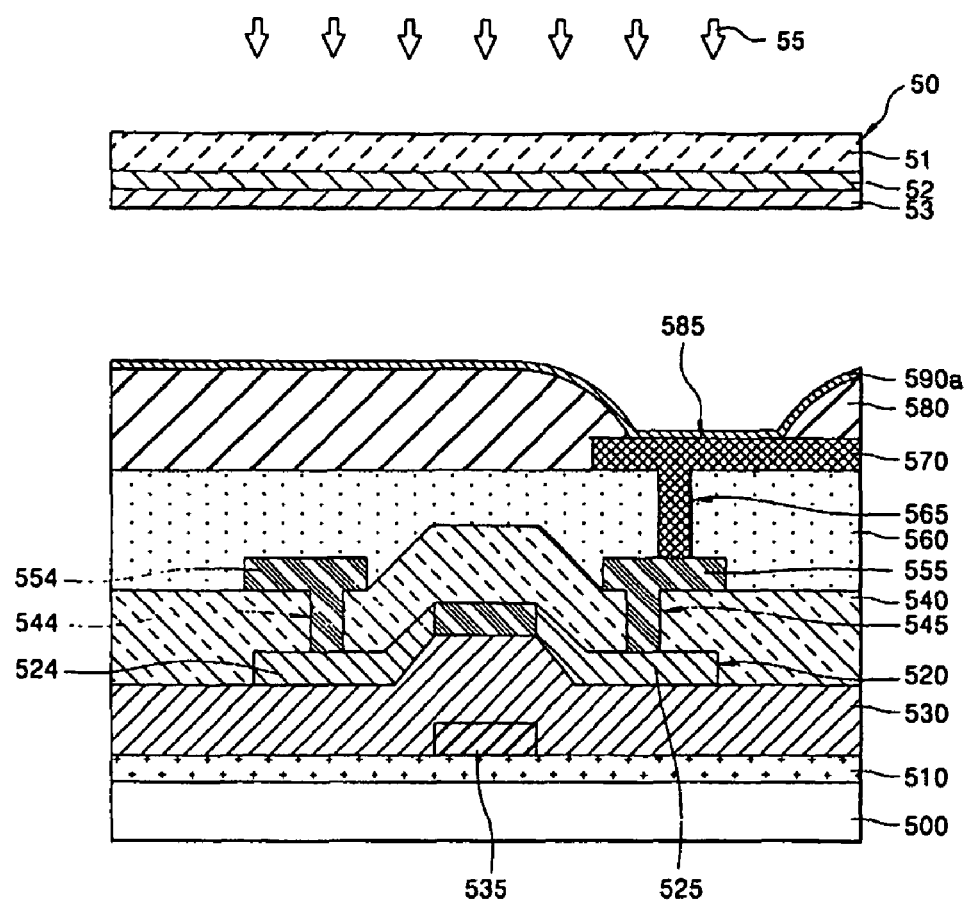
Figure 8D:
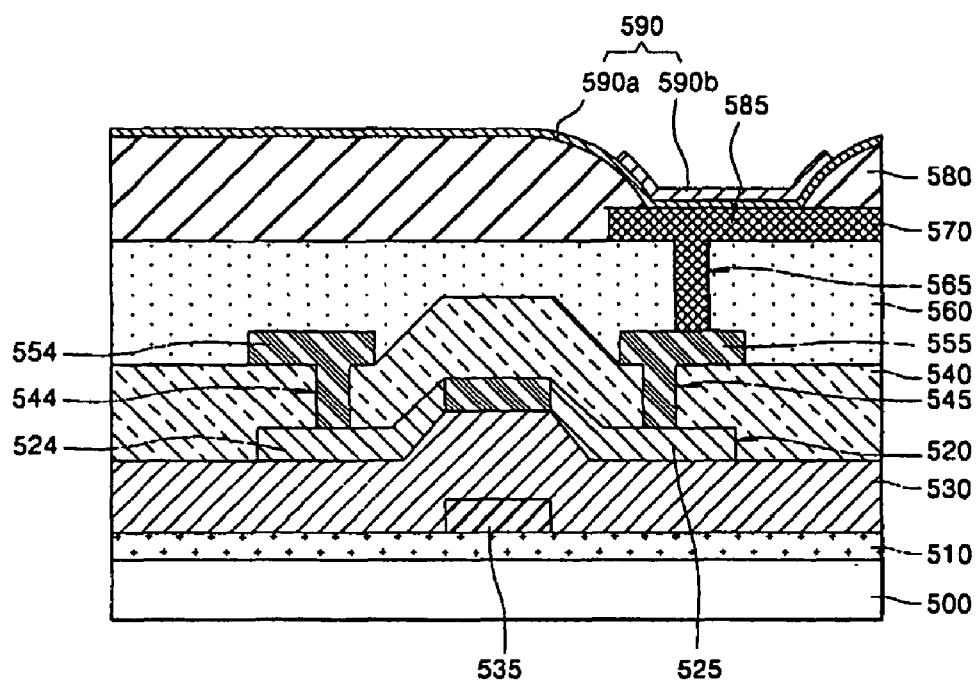

Referring to FIGS. 8C and 8D, an organic EL layer 590 is formed on the exposed portion of the pixel electrode 570 to cover an edge portion of the planarization layer 580 using a laser transfer technique.

In more detail, a PEDOT is spin-coated to a thickness of 50 nm at a speed of 3000 rpm and heat-treated at a temperature of 200° C. during five minutes to thereby form a hole transport layer 590a. Subsequently, three pieces of transfer films are manufactured. For the sake of description convenience, a method of manufacturing one transfer film 50 for an R color pattern is described.

The transfer film 50 for the R color pattern is manufactured as follows: on a base film 51 having a transfer layer 52 formed thereon, an R color organic electroluminescent material is spin-coated to a thickness of 80 nm at a speed of 2000 rpm using a xylene solution having a concentration of 1.0 wt/V %.

After aligning the transfer film 50 with the array substrate, the transfer film 50 is scanned by an infrared-rays laser so that a desired pattern is transferred to the hole transport layer 590a, thereby forming the R color pattern 590b of the organic EL layer. In the same method, G and B color patterns are formed to complete the organic EL layer 590. The organic EL layer 590 can further include a hole injection layer, an electron transport layer and an electron injection layer.

A cathode electrode 595 is formed on the planarization layer 580 and covers the organic EL layer 590. Preferably, the cathode electrode 595 has a dual-layered structure of Ca/Ag. Preferably, the Ca layer and the Ag layer have a thickness of 30 nm and 270 nm, respectively.

Finally, an encapsulation process is performed to complete the organic EL display device.

The methods of manufacturing the organic EL display device described above can be applied to those of FIGS. 4 and 6.

Figure 9:
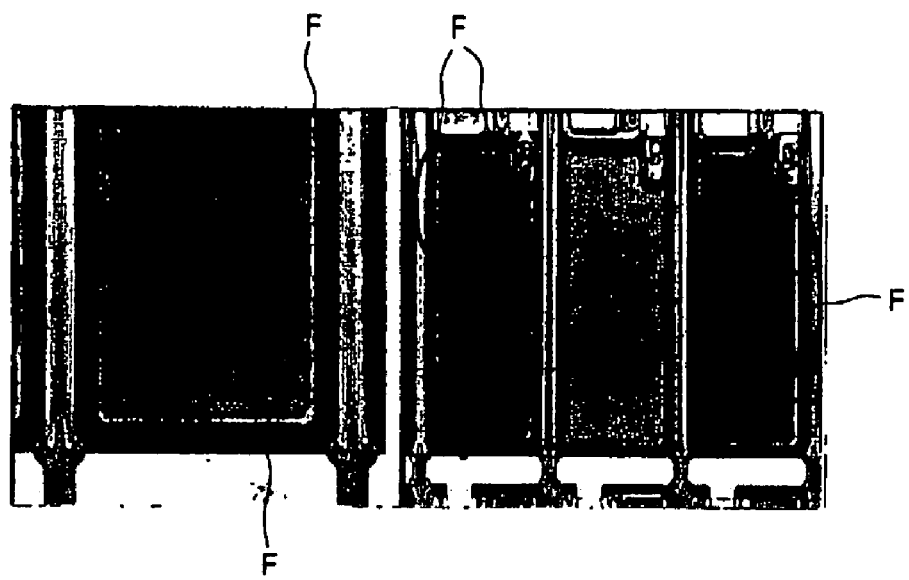
FIG. 9 is a photograph illustrating the organic EL layer of the conventional organic EL display device.

FIG. 9 is a photograph illustrating the organic EL layer of the conventional organic EL display device of FIG. 1. As can be seen in FIG. 9, when a thickness of a portion of the insulating layer 180 corresponding to an edge of the pixel electrode 170 is more than 500 nm, the organic EL layer has defects F. That is, the organic EL layer is separated from the pixel electrode 170 or a boundary of the organic EL layer is not formed clearly.

FIG. 10 is a photograph illustrating the organic EL layer of the organic EL display device according to the present invention. As can be seen in FIG. 10, when a thickness of a portion of the insulating layer corresponding to an edge of the pixel electrode is less than 500 nm, the organic EL layer has no defects. That is, the organic EL layer having a stable color pattern can be achieved.

For the laser transfer process, the transfer film having a thickness 50 nm to 100 nm is in contact with the array substrate. However, a step difference between the insulating layer and the pixel electrode is relatively great, for example, more than 500 nm, and the transfer film is not in contact with the array substrate. Therefore, the color pattern is unstably transferred to the array substrate, leading to defects of the organic EL layer. In the present invention, the insulating layer is formed to make the step difference between the insulating layer and the pixel electrode to be relatively low, i.e., less than 500 nm, so as to prevent the defect.

Meanwhile, the insulating layer is generally formed to a thickness of more than 1 μm to prevent a parasitic capacitor which may occur between the pixel electrode and the cathode electrode. However, even though the insulating layer is formed to a thickness of less than 500 nm, the parasitic capacitor does not occur.

The present invention can be applied to the active matrix organic EL display devices having two or more TFTs in a sub-pixel employing the organic EL layer having R, G and B color pattern and can also be applied to display devices having a partition wall between color patterns and using the laser transfer technique.

As described herein before, when a thickness of a portion of the insulating layer corresponding to an edge of the pixel electrode is less than 500 nm, it is possible to prevent defects of the organic EL layer in a boundary between the insulating layer and the pixel electrode, and a clean color pattern of the organic EL layer can be formed.

Although a few preferred embodiments of the present invention have been shown and described, it will be appreciated by those skilled in the art that changes may be made in these embodiments without departing from the principles and spirit of the invention, the scope of which is defined in the claims and the equivalents.

What is claimed is:

1. A method for fabricating a display device, comprising:
    forming an underlying layer on a substrate;
    forming an insulating layer on the underlying layer to extend in a range at or between 100 nm and 500 nm from a top of the underlying layer while exposing a portion of the underlying layer to form a channel, the formed insulating layer having an opposing edge tapering into the exposed portion of the underlying layer to form a boundary of the channel; and
    forming an organic electroluminescent layer on the exposed portion of the underlying layer and over the edge of the insulating layer so as to contact the underlying layer and the insulating layer by a Laser Induced Thermal Imaging (LITI) method, so that the organic electroluminescent layer is entirely within the channel, the edge of the insulating layer intrudes between the organic electroluminescent layer and the underlying layer, and an end of the organic electroluminescent layer on the edge of the insulating layer is separated from the underlying layer by the edge of the insulating layer;
    wherein the insulating layer is less than 200 nm thick.

2. The method of claim 1, wherein the forming of the insulating layer comprises forming the edge of the insulating layer to have a taper angle of about 15° relative to the underlying layer.

3. The method of claim 1, wherein the forming of the organic electroluminescent layer comprises forming the organic electroluminescent layer on the insulating layer so that a thickness of the organic electroluminescent layer formed over the edge of the insulating layer is the same as a thickness of the organic electroluminescent layer formed on the underlying layer.

4. The method of claim 1, wherein forming of the insulating layer includes forming the edge of the insulating layer to be rounded.

5. A method for fabricating a display device, comprising:
    forming an underlying layer on a substrate;
    forming an insulating layer on the underlying layer to extend in a range at or between 100 nm and 500 nm from a top of the underlying layer while exposing a portion of the underlying layer to form a channel, the formed insulating layer having an opposing edge tapering into the exposed portion of the underlying layer to form a boundary of the channel; and
    forming an organic electroluminescent layer on the exposed portion of the underlying layer and over the edge of the insulating layer so as to contact the underlying layer and the insulating layer by a Laser Induced Thermal Imaging (LITI) method, so that the organic electroluminescent layer is entirely within the channel, the edge of the insulating layer intrudes between the organic electroluminescent layer and the underlying layer, and an end of the organic electroluminescent layer on the edge of the insulating layer is separated from the underlying layer by the edge of the insulating layer;
    wherein a thickness of the insulating layer is in a range at or between 100 nm and 200 nm.

6. The method of claim 5, wherein the portion of the insulating layer from the edge of the underlying layer to the top of the insulating layer has a thickness in a range at or between 100 nm and 200 nm.

7. A method for fabricating a display device, comprising:
forming a thin film transistor having a source electrode and a drain electrode on a substrate;
forming a lower electrode coupled to the source electrode or the drain electrode,
forming an insulating layer to extend in a range at or between 100 nm and 500 nm from a top of the lower electrode while exposing a portion of the lower electrode to form a channel, the formed insulating layer having an opposing edge tapering into the exposed portion of the lower electrode to form a boundary of the channel; and
forming an organic electroluminescent layer on the exposed portion of the lower electrode and over the edge of the insulating layer so as to contact the lower electrode and the insulating layer by a Laser Induced Thermal Imaging (LITI) method, so that the organic electroluminescent layer is entirely within the channel, the edge of the insulating layer intrudes between the organic electroluminescent layer and the lower electrode, and an end of the organic electroluminescent layer on the edge of the insulating layer is separated from the lower electrode by the edge of the insulating layer;
wherein the insulating layer is less than 200 nm thick.

8. The method of claim 7, wherein the forming of the organic electroluminescent layer comprises forming the organic electroluminescent layer on the insulating layer so that a thickness of the organic electroluminescent layer formed over the edge of the insulating layer is the same as a thickness of the organic electroluminescent layer formed on the lower electrode.

9. A method for fabricating a display device, comprising:
forming a thin film transistor having a source electrode and a drain electrode on a substrate;
forming a lower electrode coupled to the source electrode or the drain electrode;
forming an insulating layer to extend in a range at or between 100 nm and 500 nm from a top of the lower electrode while exposing a portion of the lower electrode to form a channel, the formed insulating layer having an opposing edge tapering into the exposed portion of the lower electrode to form a boundary of the channel; and
forming an organic electroluminescent layer on the exposed portion of the lower electrode and over the edge of the insulating layer so as to contact the lower electrode and the insulating layer by a Laser Induced Thermal Imaging (LITI) method, so that the organic electroluminescent layer is entirely within the channel, the edge of the insulating layer intrudes between the organic electroluminescent layer and the lower electrode, and an end of the organic electroluminescent layer on the edge of the insulating layer is separated from the lower electrode by the edge of the insulating layer;
wherein a thickness of the insulating layer is in a range at or between 100 nm and 200 nm.

10. The method of claim 9, wherein the portion of the insulating layer from the edge of the lower electrode to the top of the insulating layer has a thickness in a range at or between 100 nm and 200 nm.

11. A method for fabricating a display device, comprising:
forming an underlying layer on a substrate;
forming an insulating layer to have a step difference between an upper surface of the insulating layer and an upper surface of the underlying layer in a range at or between 100 nm and 500 nm while exposing a portion of the underlying layer to form a channel, the formed insulating layer having an opposing edge tapering into the exposed portion of the underlying layer to form a boundary of the channel; and
forming an organic electroluminescent layer on the exposed portion of the underlying layer and over the edge of the insulating layer so as to contact the underlying layer and the insulating layer by a Laser Induced Thermal Imaging (LITI) method, so that the organic electroluminescent layer is entirely within the channel, the edge of the insulating layer intrudes between the organic electroluminescent layer and the underlying layer, and an end of the organic electroluminescent layer on the edge of the insulating layer is separated from the underlying layer by the edge of the insulating layer;
wherein the insulating layer is less than 200 nm thick.

12. The method of claim 11, wherein the forming of the organic electroluminescent layer comprises forming the organic electroluminescent layer on the insulating layer so that a thickness of the organic electroluminescent layer formed over the edge of the insulating layer is the same as a thickness of the organic electroluminescent layer formed on the underlying layer.

13. A method for fabricating a display device, comprising:
forming an underlying layer on a substrate;
forming an insulating layer to have a step difference between an upper surface of the insulating layer and an upper surface of the underlying layer in a range at or between 100 nm and 500 nm while exposing a portion of the underlying layer to form a channel, the formed insulating layer having an opposing edge tapering into the exposed portion of the underlying layer to form a boundary of the channel; and
forming an organic electroluminescent layer on the exposed portion of the underlying layer and over the edge of the insulating layer so as to contact the underlying layer and the insulating layer by a Laser Induced Thermal Imaging (LITI) method, so that the organic electroluminescent layer is entirely within the channel, the edge of the insulating layer intrudes between the organic electroluminescent layer and the underlying layer, and an end of the organic electroluminescent layer on the edge of the insulating layer is separated from the underlying layer by the edge of the insulating layer;
wherein a thickness of the insulating layer is in a range at or between 100 nm and 200 nm.

14. The method of claim 13, wherein the step difference is in a range at or between 100 nm to 200 nm.

15. A method for fabricating a display device, comprising:
forming a thin film transistor having a source electrode and a drain electrode;
forming a lower electrode coupled to the source electrode or the drain electrode;
forming an insulating layer to have a step difference between an upper surface of the insulating layer and an upper surface of the lower electrode in a range at or between 100 and 500 nm while exposing a portion of the lower electrode to form a channel, the formed insulating layer having an opposing edge tapering into the exposed portion of the lower electrode to form a boundary of the channel; and
forming an organic electroluminescent layer on the exposed portion of the lower electrode and over the edge of the insulating layer so as to contact the lower electrode and the insulating layer by a Laser Induced Thermal Imaging (LITI) method, so that the organic electroluminescent layer is entirely within the channel, the edge of the insulating layer intrudes between the organic electroluminescent layer and the lower electrode, and an end of the organic electroluminescent layer on the edge of the insulating layer is separated from the lower electrode by the edge of the insulating layer;

wherein the insulating layer is less than 200 nm thick.

16. The method of claim 15, wherein the forming of the organic electroluminescent layer comprises forming the organic electroluminescent layer on the insulating layer so that a thickness of the organic electroluminescent layer formed over the edge of the insulating layer is the same as a thickness of the organic electroluminescent layer formed on the lower electrode.

17. A method for fabricating a display device, comprising:
- forming a thin film transistor having a source electrode and a drain electrode;
- forming a lower electrode coupled to the source electrode or the drain electrode;
- forming an insulating layer to have a step difference between an upper surface of the insulating layer and an upper surface of the lower electrode in a range at or between 100 and 500 nm while exposing a portion of the lower electrode to form a channel, the formed insulating layer having an opposing edge tapering into the exposed portion of the lower electrode to form a boundary of the channel; and
- forming an organic electroluminescent layer on the exposed portion of the lower electrode and over the edge of the insulating layer so as to contact the lower electrode and the insulating layer by a Laser Induced Thermal Imaging (LITI) method, so that the organic electroluminescent layer is entirely within the channel, the edge of the insulating layer intrudes between the organic electroluminescent layer and the lower electrode, and an end of the organic electroluminescent layer on the edge of the insulating layer is separated from the lower electrode by the edge of the insulating layer;

wherein a thickness of the insulating layer is in a range at or between 100 nm and 200 nm.

18. The method of claim 17, wherein the step difference is in a range at or between 100 nm to 200 nm.

* * * * *